United States Patent
Simin et al.

(10) Patent No.: US 9,806,184 B2
(45) Date of Patent: Oct. 31, 2017

(54) SEMICONDUCTOR DEVICE WITH LOW-CONDUCTING FIELD-CONTROLLING ELEMENT

(71) Applicant: Sensor Electronic Technology, Inc., Columbia, SC (US)

(72) Inventors: Grigory Simin, Columbia, SC (US); Michael Shur, Latham, NY (US); Remigijus Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

(21) Appl. No.: 15/052,911

(22) Filed: Feb. 25, 2016

(65) Prior Publication Data

US 2016/0181410 A1 Jun. 23, 2016

Related U.S. Application Data

(62) Division of application No. 13/604,984, filed on Sep. 6, 2012, now abandoned.

(Continued)

(51) Int. Cl.
  *H01L 29/778* (2006.01)
  *H01L 29/66* (2006.01)
  (Continued)

(52) U.S. Cl.
  CPC ...... *H01L 29/7787* (2013.01); *H01L 29/0649* (2013.01); *H01L 29/2003* (2013.01);
  (Continued)

(58) Field of Classification Search
  CPC ... H01L 29/24; H01L 29/405; H01L 29/1075; H01L 29/78; H01L 29/772; H01L 21/20;
  (Continued)

(56) References Cited

U.S. PATENT DOCUMENTS 4,638,341 A   1/1987  Baier et al.
5,126,284 A   6/1992  Curran
(Continued)

FOREIGN PATENT DOCUMENTS

JP   2007048866       2/2007
KR   20100138871 A   12/2010

OTHER PUBLICATIONS

Gondarenko, U.S. Appl. No. 13/604,984, Final Office Action, Jul. 14, 2016, 28 pages.
(Continued)

*Primary Examiner* — Natalia Gondarenko
(74) *Attorney, Agent, or Firm* — LaBatt, LLC

(57) ABSTRACT

A semiconductor device including a low conducting field-controlling element is provided. The device can include a semiconductor including an active region (e.g., a channel), and a set of contacts to the active region. The field-controlling element can be coupled to one or more of the contacts in the set of contacts. The field-controlling element can be formed of a low conducting layer of material and have a lateral resistance that is both larger than an inverse of a minimal operating frequency of the device and smaller than an inverse of a maximum control frequency of the device.

20 Claims, 9 Drawing Sheets

Related U.S. Application Data

(60) Provisional application No. 61/531,585, filed on Sep. 6, 2011.

(51) Int. Cl.
*H01L 29/40* (2006.01)
*H01L 29/06* (2006.01)
*H01L 29/205* (2006.01)
*H01L 29/20* (2006.01)

(52) U.S. Cl.
CPC .......... *H01L 29/205* (2013.01); *H01L 29/404* (2013.01); *H01L 29/405* (2013.01)

(58) Field of Classification Search
CPC . H01L 21/335; H01L 29/205; H01L 29/0649; H01L 29/404; H01L 29/2003; H01L 2924/1305; H01L 2924/13055; H01L 2924/13064; H01L 29/778–29/7789; H01L 29/122–29/127; H01L 29/15–29/158; H01L 29/41758; H01L 29/66431; H01L 29/66462; G06F 17/50
USPC ................ 257/77, 192, 194, 409, 280, 664, 257/E29.111, E29.317, E29.255, E29.246
See application file for complete search history.

(56) References Cited

U.S. PATENT DOCUMENTS

| | | | |
|---|---|---|---|
| 5,196,907 A | 3/1993 | Birkle et al. |
| 5,241,193 A | 8/1993 | Pfiester et al. |
| 5,552,714 A | 9/1996 | Adamian et al. |
| 6,107,649 A | 8/2000 | Zhao |
| 6,207,584 B1 | 3/2001 | Shen et al. |
| 6,285,042 B1 | 9/2001 | Ohtani et al. |
| 6,538,538 B2 | 3/2003 | Hreish et al. |
| 6,589,822 B1 | 7/2003 | Yamazaki et al. |
| 6,690,042 B2 | 2/2004 | Khan et al. |
| 6,690,176 B2 | 2/2004 | Toncich |
| 6,759,839 B2 | 7/2004 | Kodato |
| 6,812,714 B2 | 11/2004 | Verspecht et al. |
| 6,878,593 B2 | 4/2005 | Khan et al. |
| 6,903,385 B2 | 6/2005 | Gaska et al. |
| 6,998,833 B2 | 2/2006 | Wang et al. |
| 7,248,866 B1 | 7/2007 | Tsironis |
| 7,282,911 B2 | 10/2007 | Xiang et al. |
| 7,548,069 B2 | 6/2009 | Simpson |
| 7,674,666 B2 | 3/2010 | Simin et al. |
| 7,714,360 B2 | 5/2010 | Otsuka et al. |
| 7,828,911 B2 | 11/2010 | Gentschev et al. |
| 8,044,432 B2 | 10/2011 | Chen et al. |
| 8,203,347 B2 | 6/2012 | Nakayama et al. |
| 8,203,348 B1 | 6/2012 | Tsironis |
| 8,461,631 B2 | 6/2013 | Simin et al. |
| 8,586,997 B2 | 11/2013 | Simin et al. |
| 2001/0009785 A1 | 7/2001 | Arafa et al. |
| 2004/0036086 A1 | 2/2004 | Khan et al. |
| 2004/0061129 A1 | 4/2004 | Saxler et al. |
| 2005/0001234 A1 | 1/2005 | Inoue et al. |
| 2005/0173728 A1 | 8/2005 | Saxler |
| 2005/0274977 A1 | 12/2005 | Saito et al. |
| 2006/0019435 A1 | 1/2006 | Sheppard et al. |
| 2006/0043415 A1 | 3/2006 | Okamoto et al. |
| 2006/0186422 A1 | 8/2006 | Gaska et al. |
| 2006/0226442 A1 | 10/2006 | Zhang et al. |
| 2006/0235638 A1 | 10/2006 | Verspecht |
| 2006/0279275 A1 | 12/2006 | Simpson |
| 2007/0278518 A1 | 12/2007 | Chen et al. |
| 2007/0295993 A1 | 12/2007 | Chen et al. |
| 2008/0121876 A1 | 5/2008 | Otsuka et al. |
| 2008/0272397 A1 | 11/2008 | Koudymov et al. |
| 2009/0008804 A1 | 1/2009 | Standing et al. |
| 2009/0173999 A1 | 7/2009 | Gaska et al. |
| 2010/0026315 A1 | 2/2010 | Simpson |
| 2010/0156475 A1 | 6/2010 | Simin et al. |
| 2010/0314666 A1* | 12/2010 | Saito ............ H01L 29/0619 257/201 |
| 2010/0327322 A1 | 12/2010 | Kub et al. |
| 2011/0095336 A1 | 4/2011 | Zundel et al. |
| 2011/0108885 A1 | 5/2011 | Sazawa et al. |
| 2012/0194276 A1* | 8/2012 | Fisher ............ H01L 27/0605 330/296 |

OTHER PUBLICATIONS

Clough et al., "Polycrystalline silicon thin film transistor incorporating a semi-insulating field plate for high voltage circuitry on glass," Applied Physics Letters, vol. 71, No. 14, Oct. 6, 1997, 4 pages.

Foutz, B. et al., "Transient electron transport in wurtzite GaN, InN, and AlN," Journal of Applied Physics, vol. 85, No. 11, Jun. 1, 1999, 8 pages.

Goud, C. et al., "Analysis and Optimal Design of Semi-Insulator Passivated High-Voltage Field Plate Structures and Comparison with Dielectric Passivated Structures," IEEE Transactions on Electron Devices, vol. 41. No. 10, Oct. 1994, 10 pages.

Hess and Brennan (1984), Handbook of Semiconductor Parameters, "7.3.2. Transport Properties in High Electric Field", vol. 1, p. 156.

Kim, International Application No. PCT/US2008/054368, "International Search Report and the Written Opinion," Jul. 30, 2008, 10 pages.

Kim, International Application No. PCT/US2012/053896, "International Search Report and the Written Opinion," Feb. 1, 2013, 9 pages.

Kim, International Application No. PCT/US2012/025146, "International Seach Report and Written Opinion," Aug. 1, 2012, 9 pages.

Koudymov et al., "RF Transmission Line Method for Wide-Bandgap Heterostructures," IEEE Electron Device Letters, vol. 30, No. 5, May 2009, 3 pages.

Lai et al., "Sub 50 nm InP HEMT Device with Fmax Greater than 1 THz," IEDM Technical Digest, IEEE, 2007, 3 pages.

Lee et al., "Record RF performance of 45-nm SOI CMOS Technology," IEDM Technical Digest, 2007, 4 pages.

Mayo Clinic, "HRL InP NMIC GHz", http://www.mayo.edu/sppdg/packaging_development.html, printed on Dec. 22, 2009, 2 pages.

Pala et al., "Drain-to-Gate Field Engineering for Improved Frequency Response of GaN-based HEMTs," IEEE, 2007, 2 pages.

Sattu et al., "AlGaN/GaN Microwave Switch With Hybrid Slow and Fast Gate Design," IEEE Electron Device Letters, vol. 31, No. 12, Dec. 2010, 3 pages.

Simin et al., "High-Power III-Nitride Integrated Microwave Switch with capacitively-coupled contacts," Department of Electrical Engineering, University of South Carolina, IEEE, 2007, 4 pages.

Simin et al., "III-Nitride transistors with capacitively coupled contacts," Applied Physics Letters, vol. 89, 033510, 2006, 3 pages.

Simin et al., "Multigate GaN RF Switches with Capactively Coupled Contacts," IEEE Electron Device Letters, vol. 30, No. 9, Sep. 2009, 3 pages.

Simin et al., "RF-Enhanced Contacts to Wide-Bandgap Devices," IEEE Electron Device Letters, vol. 28, No. 1, Jan. 2007, 3 pages.

Simin, "Wide Bandgap Devices with Non-Ohmic Contacts," ECS 2006—210th Meeting of the Electrochemical Society, Oct. 29-Nov. 3, 2006, 7 pages, Cancun, Mexico.

Stillman et al., "Closing the Gap: Plasma Wave Electronic Terahertz Detectors," Journal of Nanoelectronics and Optoelectronics, vol. 2, No. 3, Dec. 2007, 17 pages.

Turin et al., "Simulations of Field-Plated and Recessed Gate Gallium Nitride-Based Heterojunction Field-Effect Transistors," International Journal of High Speed Electronics and Systems, vol. 17, No. 1, 2007, 5 pages.

Zukauskas et al., "Solid State Lighting," http://nina.ecse.rpi.edu/shur/, Wiley, 2002, 132 pages.

Gondarenko, U.S. Appl. No. 13/604,984, Final Office Action, Oct. 23, 2015, 36 pages.

Gondarenko, U.S. Appl. No. 13/604,984, Non-Final Office Action, May 21, 2015, 19 pages.

(56) References Cited

OTHER PUBLICATIONS

Gondarenko, U.S. Appl. No. 13/604,984, Final Office Action, Jan. 2, 2015, 45 pages.
Gondarenko, U.S. Appl. No. 13/604,984, Non-Final Office Action, Sep. 2, 2014, 27 pages.
Gondarenko, U.S. Appl. No. 13/604,984, Final Office Action, Apr. 21, 2014, 19 pages.
Gondarenko, U.S. Appl. No. 13/604,984, Non-Final Office Action, Jan. 2, 2014, 44 pages.
Arora, U.S. Appl. No. 12/645,876, Non-Final Office Action, Jan. 3, 2012, 16 pages.
Arora, U.S. Appl. No. 12/645,876, Notice of Allowance, Aug. 21, 2012, 14 pages.
Benitez, U.S. Appl. No. 12/646,121, Non-Final Office Action, Mar. 29, 2012, 23 pages.
Benitez, U.S. Appl. No. 12/646,121, Final Office Action, Sep. 7, 2012, 17 pages.
Benitez, U.S. Appl. No. 12/646,121, Notice of Allowance, Nov. 19, 2012, 14 pages.
Gupta, U.S. Appl. No. 11/781,338, Non-Final Office Action, Mar. 6, 2009, 18 pages.
Gupta, U.S. Appl. No. 11/781,338, Final Office Action, Jul. 10, 2009, 15 pages.
Gupta, U.S. Appl. No. 11/781,338, Notice of Allowance, Sep. 16, 2009, 10 pages.
Smith, U.S. Appl. No. 11/781,308, Non-Final Office Action, Apr. 6, 2009, 9 pages.
Smith, U.S. Appl. No. 11/781,308, Notice of Allowance, Oct. 20, 2009, 13 pages.
Gordon, U.S. Appl. No. 11/781,302, Non-Final Office Action, May 1, 2009, 12 pages.
Gordon, U.S. Appl. No. 11/781,302, Final Office Action, Nov. 17, 2009, 23 pages.
Gordon, U.S. Appl. No. 11/781,302, Non-Final Office Action, Mar. 8, 2010, 13 pages.
Gordon, U.S. Appl. No. 11/781,302, Final Office Action, Aug. 17, 2010, 13 pages.
Gordon, U.S. Appl. No. 11/781,302, Non-Final Office Action, Jun. 27, 2012, 19 pages.
Gordon, U.S. Appl. No. 11/781,302, Final Office Action, Oct. 12, 2012, 19 pages.
Gordon, U.S. Appl. No. 11/781,302, Notice of Allowance, Feb. 14, 2013, 9 pages.
Le, U.S. Appl. No. 13/396,059, Non-Final Office Action, Feb. 27, 2013, 25 pages.
Gondarenko, U.S. Appl. No. 13/604,984, Non-Final Office Action, Mar. 14, 2016, 27 pages.

\* cited by examiner

US 9,806,184 B2

SEMICONDUCTOR DEVICE WITH LOW-CONDUCTING FIELD-CONTROLLING ELEMENT

REFERENCE TO RELATED APPLICATIONS

The current application is a divisional of U.S. patent application Ser. No. 13/604,984, which was filed on 6 Sep. 2012, and which claims the benefit of U.S. Provisional Application No. 61/531,585, titled "Semiconductor device with low-conducting field-controlling electrodes," which was filed on 6 Sep. 2011, each of which is hereby incorporated by reference. Aspects of the invention also are related to U.S. patent application Ser. No. 13/396,059, titled "Semiconductor device with low-conducting field-controlling element," which was filed on 14 Feb. 2012, which is hereby incorporated by reference.

TECHNICAL FIELD

The disclosure relates generally to semiconductor devices, and more particularly, to semiconductor devices including one or more low conducting field-controlling elements.

BACKGROUND ART

Typically, a semiconductor device is biased at Direct Current (DC) and/or modulated at relatively low frequencies, for example, below ten megahertz (MHz). Concurrently, the device can generate, amplify, and/or manipulate signals at much higher frequencies (for example, above one gigahertz (GHz)). A requirement for optimizing the device design at DC and low frequencies, on one hand, and at high frequencies are clashing and difficult or impossible to satisfy simultaneously. For example, FIG. 1 shows an illustrative heterostructure field effect transistor (HFET) 2A according to the prior art, which can be operated as a switch. When implemented in circuits such as power converters, the device dynamic on-resistance of the HFET 2A should be minimized. As a result, it is desirable to minimize a total channel length between the source electrode S and drain electrode D (e.g., the sum of the distances $L_{GS}$, $L_G$, and $L_{GD}$). However, in order for the HFET 2A to withstand high voltage levels without breakdown, the distance, $L_{GD}$, between the gate electrode G and the drain electrode D must be sufficiently large, since most of the external voltage drop will occur between these two electrodes. Therefore, the requirements for large breakdown voltage and low on resistance are clashing.

FIG. 2 shows an alternative HFET 2B, which illustrates one approach to address the breakdown problem, according to the prior art. HFET 2B includes a dielectric 3A, 3B deposited in the gate-source and gate-drain spacing and a field-modulating plate (FP). While the field-modulating plate FP is shown connected to the gate electrode G, other approaches connect one or several field-modulating plates FP to the source electrode S, drain electrode D, and/or the gate electrode G. Regardless, the field-modulating plate FP decreases a peak field near the electrode edge by splitting it into two or more peaks, thereby increasing the breakdown voltage of the HFET 2B. However, the field-modulating plate FP increases the inter-electrode and electrode-semiconductor capacitances, and thus decreases a maximum operating frequency for the HFET 2B.

FIGS. 3A and 3B show an illustrative HFET 2C in the on state and the off state, respectively, when being operated as a radio frequency (RF) switch according to the prior art. In the on state illustrated in FIG. 3A, a conducting channel 4 exists between the source electrode S and the drain electrode D. To turn the HFET 2C off, a corresponding bias is applied at the gate electrode G, which removes the channel under the gate electrode G thereby disconnecting the drain electrode D from the source electrode S. However, this disconnection is only true at low frequencies. At high frequencies as illustrated in FIG. 3B, a capacitive coupling is present between the source and drain sides of the channel which reduces a maximum operating frequency for the HFET 2C. If the channel 4 had been fully depleted in the entire source—drain spacing, the device capacitance would be lower and the maximum operating frequency would be higher.

SUMMARY OF THE INVENTION

In light of the above, the inventors recognize that a solution providing, for example, increased (e.g., full) control over the electric field distribution in the gate-drain spacing can result in significant improvement of the high voltage and high frequency (e.g., microwave) characteristics of a field effect transistor. For example, embodiments of the invention can provide a semiconductor device with an increased frequency range, an increased operating voltage, and/or an increased maximum power compared to semiconductor devices of the prior art. Aspects of the invention provide a semiconductor device including a low conducting field-controlling element. The device can include a semiconductor including an active region (e.g., a channel), and a set of contacts to the active region. The field-controlling element can be coupled to one or more of the contacts in the set of contacts. The field-controlling element can be formed of a low conducting layer of material and have a lateral resistance that is both larger than an inverse of a minimal operating frequency of the device and smaller than an inverse of a maximum control frequency of the device. The field-controlling element can behave similar to a metal electrode at direct current and/or low frequencies. However, within the device operating frequency range, the field-controlling element can behave similar to an insulator.

A first aspect of the invention provides a device comprising: a semiconductor including an active region; a set of contacts to the active region; and a field-controlling element located on a first side of the active region, wherein a lateral resistance of the field-controlling element is larger than an inverse of a minimal operating frequency of the device and the lateral resistance of the field-controlling element is smaller than an inverse of a maximum control frequency of the device.

A second aspect of the invention provides a field-effect transistor comprising: a source contact, a drain contact, and a device channel there between; a gate located on a first side of the device channel; and a low conducting field-controlling element located on the first side of the device channel, wherein the field-controlling element is coupled to at least one of: the source contact, the drain contact, or the gate and wherein a lateral resistance of the field-controlling element is larger than an inverse of a minimal operating frequency of the device and the lateral resistance of the field-controlling element is smaller than an inverse of a maximum control frequency of the device.

A third aspect of the invention provides a method comprising: designing a semiconductor device including an active region, a set of contacts to the active region, and a field-controlling element located on a first side of the active region, wherein the designing includes: determining a target minimal operating frequency of the device and a target maximum control frequency of the device; determining a target lateral resistance for the field-controlling element such that the target lateral resistance is both larger than an inverse of the target minimal operating frequency and smaller than an inverse of the target maximum control frequency; and designing the field-controlling element based on the target lateral resistance.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a semiconductor device including a low conducting field-controlling element. The device can include a semiconductor including an active region (e.g., a channel), and a set of contacts to the active region. The field-controlling element can be coupled to one or more of the contacts in the set of contacts. The field-controlling element can be formed of a low conducting layer of material and have a lateral resistance that is both larger than an inverse of a minimal operating frequency of the device and smaller than an inverse of a maximum control frequency of the device. The field-controlling element can behave similar to a metal electrode at direct current and/or low frequencies. However, within the device operating frequency range, the field-controlling element can behave similar to an insulator. In an embodiment, the field-controlling element can be configured to increase a frequency range, an operating voltage, a maximum power, and/or the like, for operating the corresponding semiconductor device. As used herein, unless otherwise noted, the term "set" means one or more (i.e., at least one) and the phrase "any solution" means any now known or later developed solution.

Figure 4:
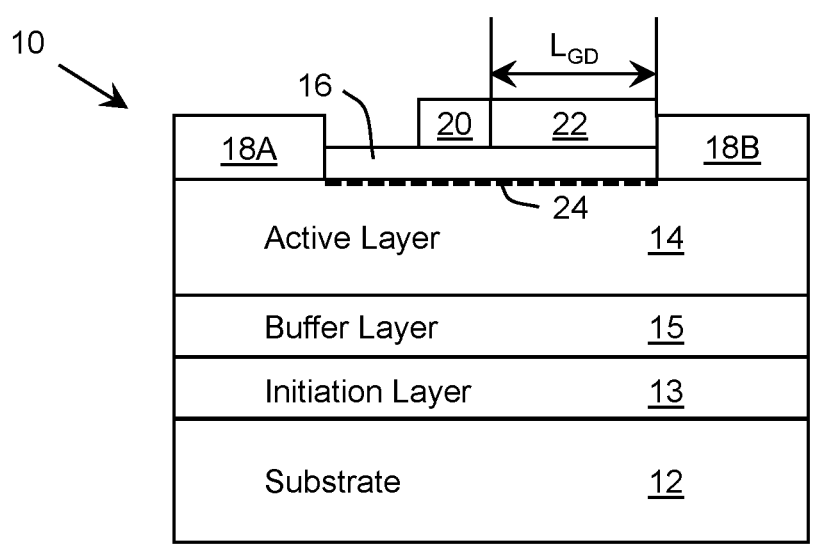
FIG. 4 shows an illustrative semiconductor device according to a first embodiment.

Returning to the drawings, FIG. 4 shows an illustrative semiconductor device 10 according to a first embodiment. The device 10 is shown including a substrate 12, an initiation layer 13, a buffer layer 15, an active layer 14, a barrier layer 16, a source contact 18A, a drain contact 18B, and a gate 20, each of which can be manufactured and fabricated using any solution. The substrate 12 can be formed of any of various types of compound semiconductor or dielectric materials, including for example, sapphire, diamond, germanium (Ge), gallium nitride (GaN), silicon, silicon carbide (SiC), gallium arsenic (GaAs), and/or the like. Furthermore, the substrate 12 can comprise a conducting and/or semiconducting substrate.

As illustrated, an initiation layer 13 and a buffer layer 15 can be located between the substrate 12 and the active layer 14. However, it is understood that this is only illustrative of various possible configurations, each of which can include or not include the initiation layer 13 and/or the buffer layer 15. Regardless, the heterostructure of the device 10 can include various layers made from any of a plurality of materials systems. Furthermore, one or more of the layers in a heterostructure described herein can include one or more attributes to alleviate strain. For example, a layer can be formed of a superlattice structure.

In an embodiment, the substrate 12 is formed of SiC, the active layer 14 is formed of gallium nitride (GaN), and the barrier layer 16 is formed of aluminum gallium nitride (AlGaN). However, it is understood that this is only illustrative of various possible group III nitride based devices. To this extent, layers 13, 14, 15, 16 can be formed of any combination of various types of group III nitride materials comprising one or more group III elements (e.g., boron (B), aluminum (Al), gallium (Ga), and indium (In)) and nitrogen (N), such that $B_{W}Al_{X}Ga_{Y}In_{Z}N$, where $0 \leq W, X, Y, Z \leq 1$, and $W+X+Y+Z=1$. Illustrative group III nitride materials include AlN, GaN, InN, BN, AlGaN, AlInN, AlBN, InGaN, AlGaInN, AlGaBN, AlInBN, and AlGaInBN with any molar fraction of group III elements. Furthermore, it is understood that the device 10 can be formed from other semiconductor materials, including other types of group III-V materials, such as such as GaAs, GaAlAs, InGaAs, indium phosphorus (InP), and/or the like.

Additionally, the device 10 includes a low conducting field-controlling element 22, which is located in the region between the gate 20 and the drain contact 18B of the device 10 (gate-drain region). However, it is understood that a device can include one or more field-controlling elements 22 located in any combination of one or more of: the gate-source region; the gate-drain region; source-drain region; and/or the like. Furthermore, a device can include a field-controlling element 22 that forms an additional contact or passivation layer. To this extent, a field-controlling element 22 with low surface conductivity as described herein can be used in addition to or instead of regular metal electrodes.

The field-controlling element 22 can be formed of a layer of low conducting material. The low conducting material can have a surface resistance that is significantly higher than that of metal electrodes, but is also much lower than that of a dielectric material. Similarly, the low conducting material can have a surface conductivity that is significantly lower than that of metal electrodes, but is also much higher than that of a dielectric material. As a result, the associated characteristic charging-recharging time of the field-controlling element 22 is much higher than that of metal electrodes. To this extent, during operation of the device 10 at DC or low frequencies (e.g., below 10 megahertz (MHz)), typically used for pulse or sinusoidal modulation, the field-controlling element 22 will behave similar to metal electrodes. However, during operation of the device 10 at high (signal) frequencies, (e.g., typically exceeding 100 MHz) the field-controlling element 22 will behave similar to an insulator, thereby not deteriorating the device frequency performance. Illustrative low conducting materials include, for example: InGaN; a semiconductor; a low conducting dielectric single crystal; a textured, poly-crystalline or amorphous material; a semimetal material; oxides of nickel and other metals, and/or the like.

Aspects of the invention are shown and described primarily with reference to a heterostructure field effect transistor. However, it is understood that the low conducting field-controlling element 22 can be implemented in various types of field-effect transistors, including, for example, a field-effect transistor, a heterostructure field-effect transistor, an insulated gate field-effect transistor, an insulated gate heterostructure field-effect transistor, a multiple heterostructure field-effect transistor, a multiple heterostructure insulated gate field-effect transistor, an inverted field-effect transistor, an inverted heterostructure field-effect transistor, an inverted insulated gate field-effect transistor, an inverted insulated gate heterostructure field-effect transistor, an inverted multiple heterostructure field-effect transistor, an inverted insulated gate multiple heterostructure field-effect transistor, and/or the like. Additionally, the low conducting field-controlling element can be implemented in other types of semiconductor devices, including for example, a diode of any type, a semiconductor resistor, a semiconductor sensor, a light emitting diode, a laser, an integrated element, and/or the like.

As described herein, in an embodiment, it is desired for the low conducting field-controlling element 22 to act as a conductor (e.g., electrode) when the device 10 is operating at low frequencies, and act as a dielectric when the device 10 is operating within a target device operating frequency range (high frequencies). In this case, the field-controlling element 22 makes a minor increase in the total electrode area and, as a result, in the device capacitance. In an embodiment, the design and configuration of the field-controlling element 22 accounts for the frequency response for the resulting device 10. For example, contrary to other approaches, the design and configuration of the field-controlling element 22 identifies a range of acceptable lateral and/or sheet resistances and/or a target lateral and/or sheet resistance for a set of field-controlling elements 22 included in a device 10 based on a target operating frequency (e.g., a minimal operating frequency), a target control frequency (e.g., a maximum control frequency), and/or the like. The following discussion provides a theoretical basis for determining an illustrative set of attributes of the device 10 and the low conducting field-controlling element 22 as currently understood by the inventors.

In order for the field-controlling element 22 to not significantly affect a radio frequency (RF) impedance of the device 10, a corresponding time constant for the field-controlling element 22, $\tau_{FC}$, must be much larger than $1/(2\pi f)$, where f is the operating frequency for the device 10. The time constant for the field-controlling element 22 can be expressed as $\tau_{FC}=R_{FC}C_{FC}$, where $R_{FC}$ is the lateral resistance of the field-controlling element 22 measured in a direction of the current flow in the device 10 along the low conducting layer surface of the field-controlling element 22 and $C_{FC}$ is the total capacitance between the field-controlling element 22 and the device channel 24. This yields the following condition:

$$\tau_{FC}=R_{FC}C_{FC}\gg 1/(2\pi f) \qquad (1)$$

Assuming $\tau_{FC}$ is at least approximately six times ($2\pi$ times) greater than $1/(2\pi f)$, the condition (1) can be rewritten as:

$$\tau_{FC}=R_{FC}C_{FC}>1/f \qquad (2)$$

As used herein, the lateral resistance of the field-controlling element 22, $R_{FC}$, is related to the low conducting layer sheet resistance, $R_{LCSH}$, as:

$$R_{FC}=R_{LCSH}*L/W \qquad (2a)$$

where L and W are the length and width, respectively, of the field-controlling element 22 with respect to a direction of the current flow in the device 10.

Furthermore, the field-controlling element 22 should be sufficiently fast to allow for pulsed modulation of a bias applied to the gate 20 of the device 10. Assuming a control frequency, $f_C$, and following the derivation that led to condition (2) above, the required $\tau_{FC}$ also should meet the following condition:

$$\tau_{FC}<1/f_C \qquad (3)$$

As an example, for practical purposes and material selection, in order to meet both conditions (2) and (3), the value of the $\tau_{FC}$ can be selected as follows:

$$\tau_{FC}=1/(f\times f_C)_{1/2} \qquad (4)$$

As an illustrative example, assume a field effect transistor has the following attributes: a source to drain distance, L=5 µm; a gate-channel separation (also equal to the field-controlling element-channel separation), d=20 nm; a channel width, W=1 mm; a relative dielectric permittivity of the material between the field-controlling element 22 and the channel 24, $\in_r$=9; an operating frequency, f=21 GHz; and a control frequency, $f_C$=10 MHz. The field-controlling element-channel capacitance can be calculated as, $C=\in_0\in_r L*W/d\approx 20$ pF, where $\in_0$ is vacuum permittivity. Using equation (4) above, a value for the time constant for the field-controlling element 22 can be calculated as, $\tau_{FC}\approx 7.1$ ns. From equation (2), the field-controlling element resistance $R_{FC}=\tau_{FC}/C_{FC}$. The corresponding sheet resistance of the low conducting layer forming the field-controlling element 22 from equation (1a) is $R_{LCSH}=R_{FC}*W/L\approx 71$ kΩ/sq. Assuming a thickness of the low conducting layer of material forming the field-controlling element 22, $d_{LC}$, of approximately 100 nm, yields a low conducting layer resistivity, $\rho=R_{LCSH}\times d_{LC}=7\times 10^{-3}\Omega\times m$.

In an embodiment, inclusion of the field-controlling element 22 in the gate-drain spacing as shown in FIG. 4 can substantially reduce/remove the electric field nonuniformity in the gate-drain spacing, thereby increasing the breakdown voltage of the device 10 over those of the prior art. At high frequencies, the field-controlling element 22 with a sheet and/or lateral resistance designed as described herein, behaves as an insulator and therefore does not increase or leads to a very minor increase in the capacitance of the device 10.

Figure 1:
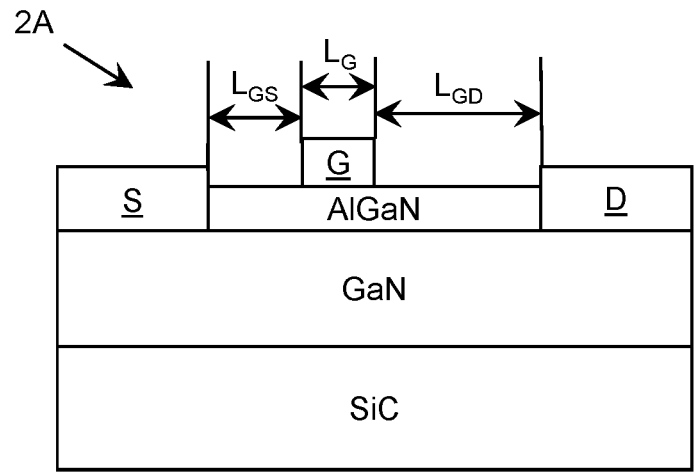
FIG. 1 shows an illustrative heterostructure field effect transistor (HFET) according to the prior art.
Figure 2:
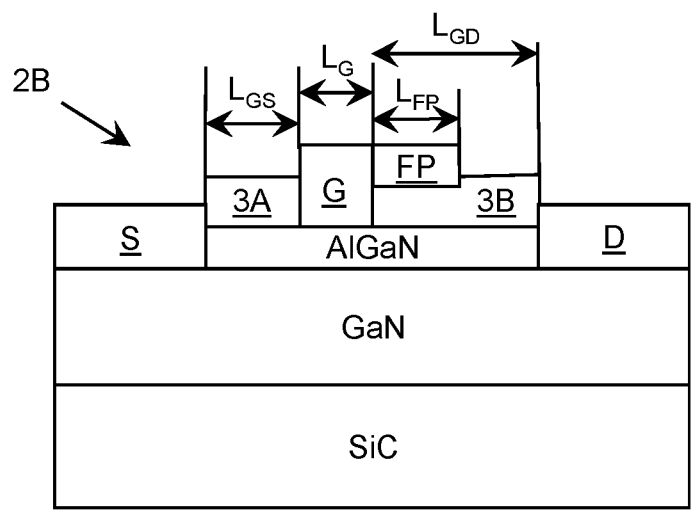
FIG. 2 shows an alternative HFET according to the prior art.
Figure 3A:
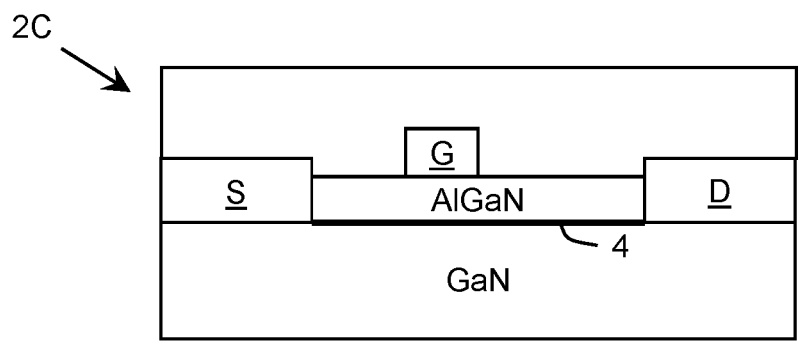
FIGS. 3A and 3B show an illustrative HFET in the on state and the off state, respectively, when being operated as a radio frequency switch according to the prior art.
Figure 3B:
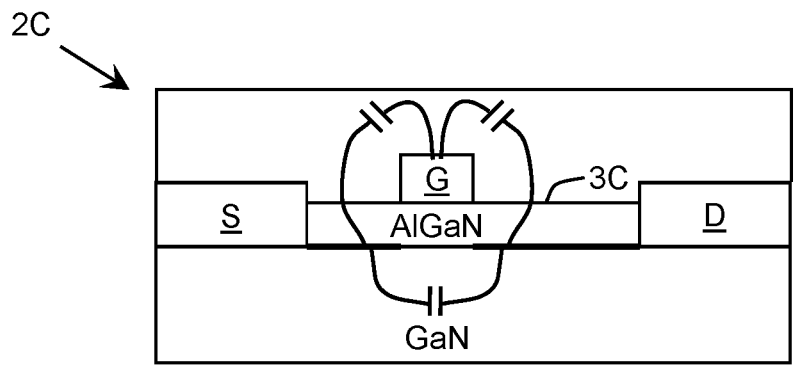
Figure 5:
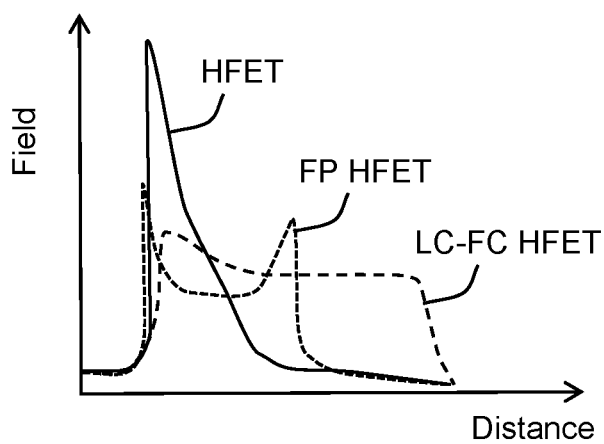
FIG. 5 shows a schematic comparison of electric field profiles in the gate-drain spacing of various HFETs according to an embodiment.

To this extent, FIG. 5 shows a schematic comparison of electric field profiles in the gate-drain spacing of various devices according to an embodiment. In particular, FIG. 5 includes: an electric field profile corresponding to the HFET 2A of FIG. 1 (identified as HFET); an electric field profile corresponding to the HFET 2B of FIG. 2 (identified as FP HFET); and an electric field profile corresponding to the device 10 of FIG. 4 (identified as LC-FC HFET). As illustrated, the electric field of the device 10 is significantly more uniform over the gate-drain spacing than that of either HFET 2A or HFET 2B.

Figure 6:
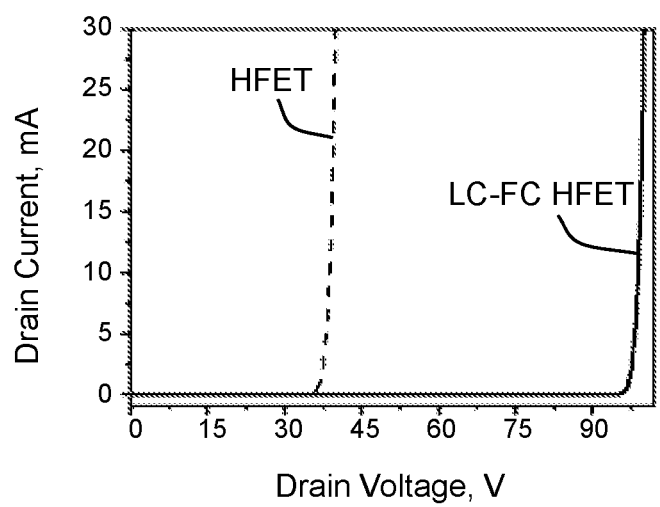
FIG. 6 shows experimental breakdown voltage characteristics of a conventional HFET and an HFET including a field-controlling electrode according to an embodiment.

Such a uniform electric field profile can result in a highest achievable breakdown voltage for a given gate-drain spacing. To this extent, FIG. 6 shows experimental breakdown voltage characteristics of a conventional HFET 2A (FIG. 1, labeled as HFET in FIG. 6) and a device 10 including the field-controlling element 22 according to an embodiment (labeled as LC-FC HFET in FIG. 6). As a proof of concept, identical geometry prior art HFET 2A and devices 10 (LC-FC HFETs) were fabricated, and the corresponding breakdown voltages compared. The field-controlling element 22 for the device 10 was formed by a Metallo Organic Chemical Vapor Deposition (MOCVD) deposited InGaN film. As illustrated in FIG. 6, the device 10 had more than a two-fold increase in breakdown voltage as compared to the breakdown voltage of the HFET 2A.

While the device 10 (FIG. 4) is shown including a field-controlling element 22 comprising a surface layer of low conducting material located within the gate-drain spacing of the device, it is understood that a device according to an embodiment can include one or more field-controlling elements located in various locations of the device depending on the desired function. To this extent, an embodiment of a device can include a field-controlling element comprising a surface layer located in the gate-source spacing of the device. Furthermore, the field-controlling element can form an additional contact or passivation layer, form a strain relieving layer, replace a metal electrode, be buried/grown in the epitaxial structure, and/or the like. Regardless, in each case and in the additional embodiments described herein, the field-controlling element can be formed of a low conducting material.

Figure 7:
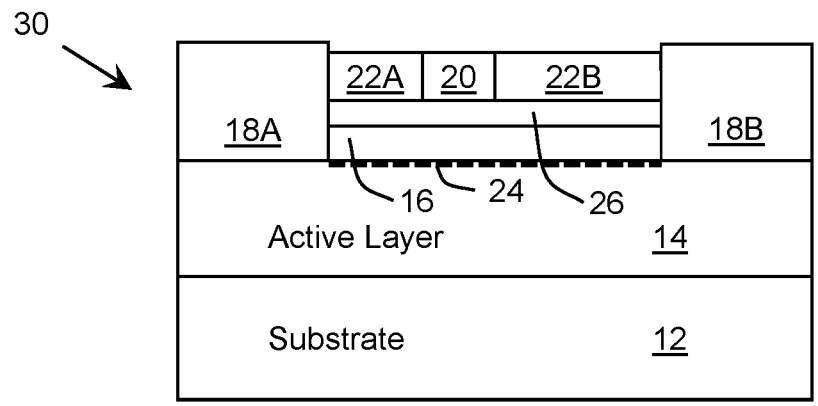
FIG. 7 shows an illustrative device according to a second embodiment.

For example, FIG. 7 shows an illustrative device 30 according to a second embodiment. Device 30 is shown including a set of low conducting field-controlling elements 22A, 22B, each of which comprises a surface layer of low conducting material located in the source-gate spacing and gate-drain spacing of the device 30, respectively. In an embodiment, the set of field-controlling elements 22A, 22B comprise a single, unitary surface layer, which can completely extend across (cover) the source-drain spacing or only partially cover the source-drain spacing. When partially covering a spacing, the set of field-controlling elements 22A, 22B can be contacting only the gate electrode 20, one or more of the device electrodes 18A, 18B, 20, or not contacting any of the device electrodes 18A, 18B, 20. Furthermore, the device 30 includes an isolation layer 26, which can be formed of a dielectric material, a semiconductor material, and/or the like, and can have a sheet resistance at least one order of magnitude higher than that of the field-controlling elements 22A, 22B. To this extent, the isolation layer 26 can partially or fully isolate the field-controlling elements 22A, 22B and the gate 20 from the semiconductor structure, thereby reducing any additional capacitance to the channel 24 provided by the field-controlling elements 22A, 22B. During operation of the device 30, the set of field-controlling elements 22A, 22B can serve as a conduction path to remove trapped charges, and therefore reduce the gate and/or drain lags, which can be observed in group III nitride HFETs and other types of devices.

Figure 8:
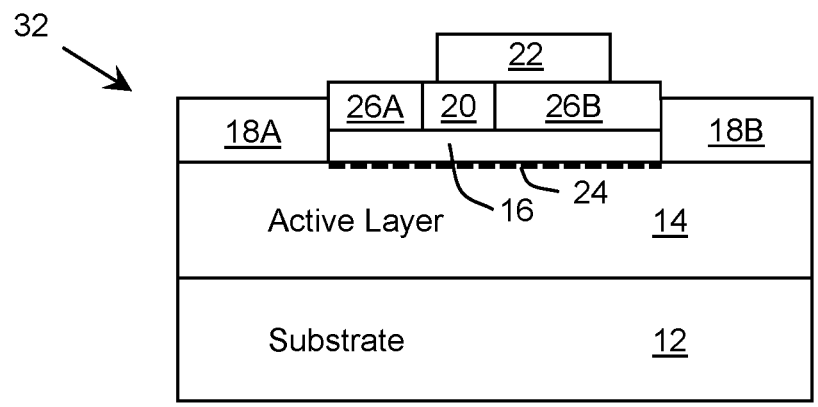
FIG. 8 shows an illustrative device according to a third embodiment.

FIG. 8 shows an illustrative device 32 according to a third embodiment. The device 32 includes a set of isolation layers 26A, 26B located in both the source-gate and gate-drain spacings, respectively. Furthermore, the device 32 includes a low conducting field-controlling element 22, which forms a field-modulating plate connected to the gate 20. To this extent, the isolation layers 26A, 26B can partially or fully isolate the field-controlling element 22 from the semiconductor structure. In this case, unlike the field plate FP (FIG. 2) of the prior art, the field-controlling element 22 does not form any significant additional capacitance to the drain electrode 18B or the channel 24, and therefore does not deteriorate the frequency performance of the device 32.

Figure 9:
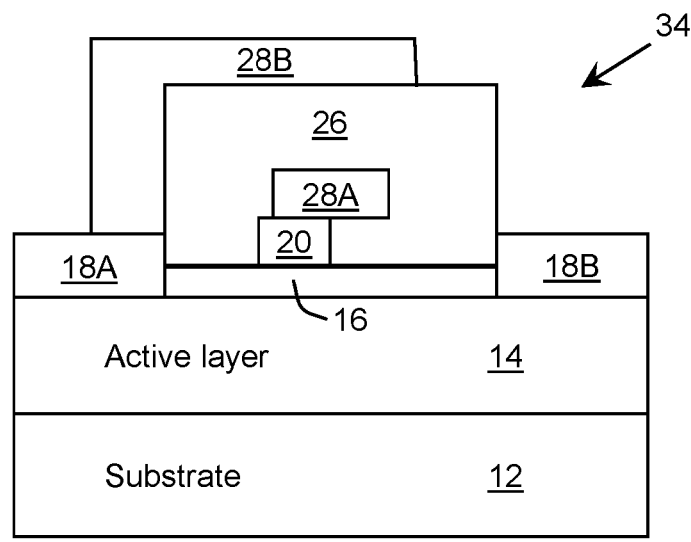
FIG. 9 shows an illustrative device according to a fourth embodiment.

FIG. 9 shows an illustrative device 34 according to a fourth embodiment. In this case, the device 34 includes a first field-controlling element 28A connected to the gate electrode 20, and a second field-controlling element 28B connected to the source electrode 18A. An isolation layer 26 encapsulates the gate 20 and the first field-controlling element 28A, thereby isolating the second field-controlling element 28B from the gate 20 and the first field-controlling element 28A. In an embodiment, at least one of the first field-controlling element 28A or the second field-controlling element 28B is formed of a low conducting layer of material as described herein while one of the elements 28A, 28B can be made of metal.

Figure 10:
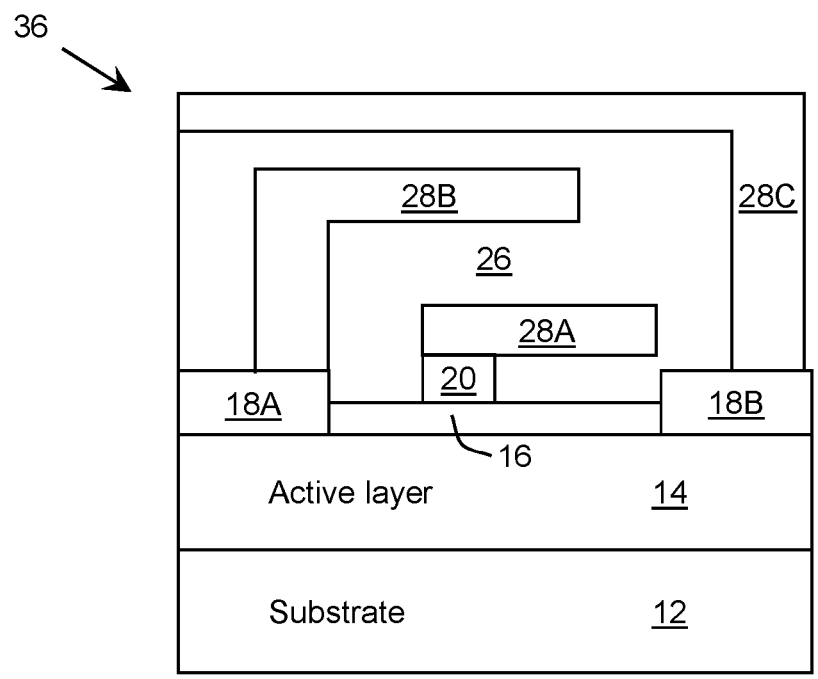
FIG. 10 shows an illustrative device according to a fifth embodiment.

FIG. 10 shows an illustrative device 36 according to a fifth embodiment. In this case, the device 36 is configured similar to the device 34 of FIG. 9, but also includes a third field-controlling element 28C connected to the drain electrode 18B. Additionally, the isolation layer 26 is extended over the second field-controlling element 28B, thereby isolating the third field-controlling element 28C from the second field-controlling element 28B. In this case, one or more of the field-controlling elements 28A-28C can be formed of a low conducting layer of material, while at most two of the field-controlling elements 28A-28C can be formed of metal. As discussed herein, in either device 34, 36, one or more of the field-controlling elements 28A-28C can be made of metal. It is understood that a particular configuration of field-controlling elements 28A-28C formed of a low conducting layer of material and/or metal, if included, can be selected based on a particular set of device requirements and/or operating frequencies.

Figure 11A:
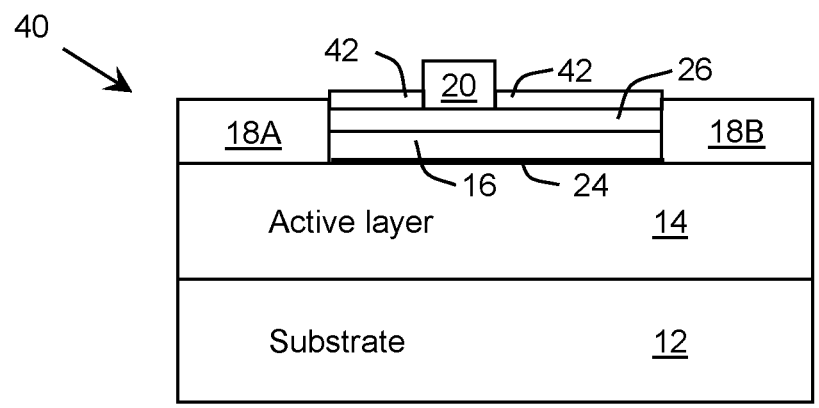
FIGS. 11A and 11B show an illustrative HFET configured to operate as a radio frequency (RF) switch according to an embodiment.
Figure 11B:
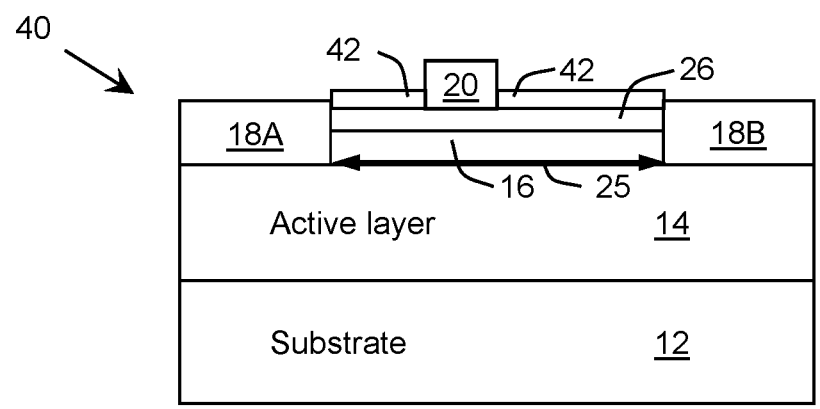

FIGS. 11A and 11B show an illustrative HFET 40 configured to operate as a radio frequency (RF) switch in the on and off states, respectively, according to an embodiment. HFET 40 includes a low conducting field-controlling element 42 located within the source-drain spacing. Similar to the device 30 (FIG. 7), the field-controlling element 42 of HFET 40 can be electrically connected to the gate electrode 20 and partially or entirely cover the source-drain spacing. In this configuration, the field-controlling element 42 can be used to deplete the channel 24 in the entire source-drain spacing. For example, an external bias applies the same potential to the low conducting element 42 as that at the gate electrode 20. As a result, when the channel 24 is depleted under the gate electrode 20, the depletion 25 extends under the low conducting element 42 as illustrated by the arrows in FIG. 11B. The depletion 25 can significantly reduce an internal capacitance of the HFET 40 when it is in the off state. A low conducting field-controlling element 42 with a lateral and/or sheet resistance designed as described herein, can have a minimal effect on a source-drain coupling of the HFET 40 in the off state.

Figure 12:
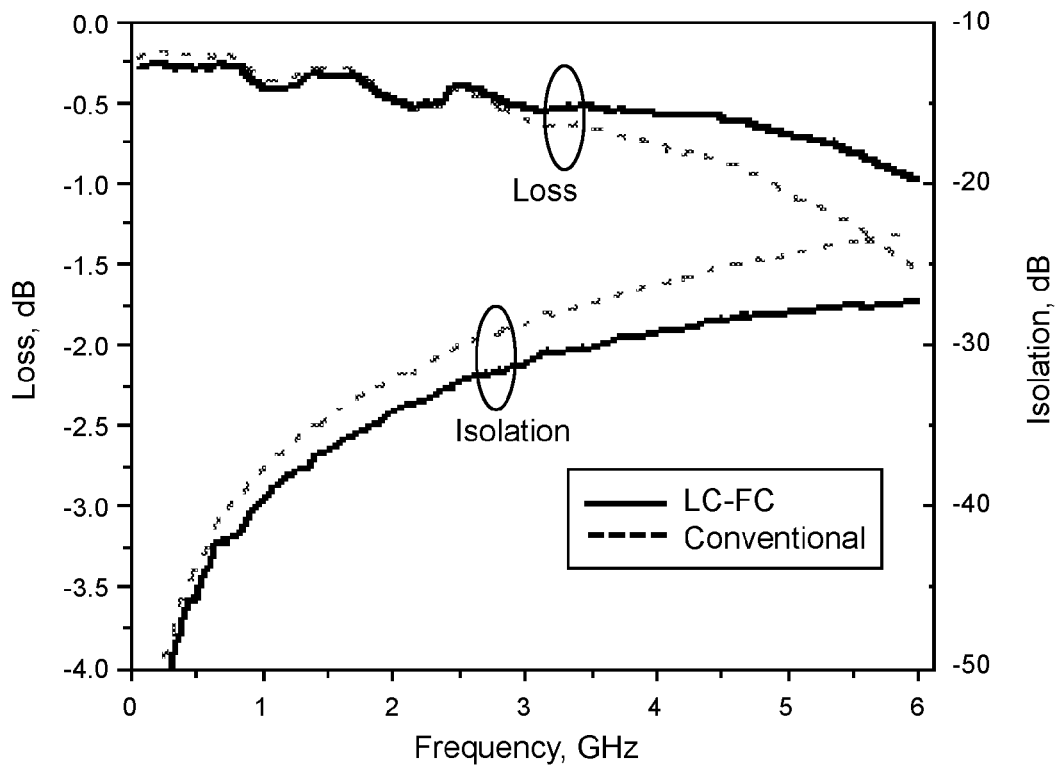
FIG. 12 shows experimental insertion loss and isolation characteristics of a prior art RF switch and an RF switch made using an HFET according to an embodiment.

FIG. 12 shows experimental insertion loss and isolation characteristics of a prior art RF switch (labeled Conventional in FIG. 12) and an RF switch made using an HFET according to an embodiment (labeled LC-FC in FIG. 12). In particular, identical geometry prior art HFET and low conducting element HFET RF switches were fabricated and their corresponding insertion loss and isolation were compared. The low conducting element was formed by a MOCVD deposited InGaN film as shown in FIGS. 11A, 11B. The insertion loss and isolation frequency dependencies for the resulting single-pole-double-throw (SPDT) RF switches are illustrated in FIG. 12. As illustrated, at an operating frequency of approximately six gigahertz, nearly a two-fold decrease in the insertion loss and approximately a six decibel increase in the isolation were obtained for the low conducting element HFET RF switch.

Figure 13:
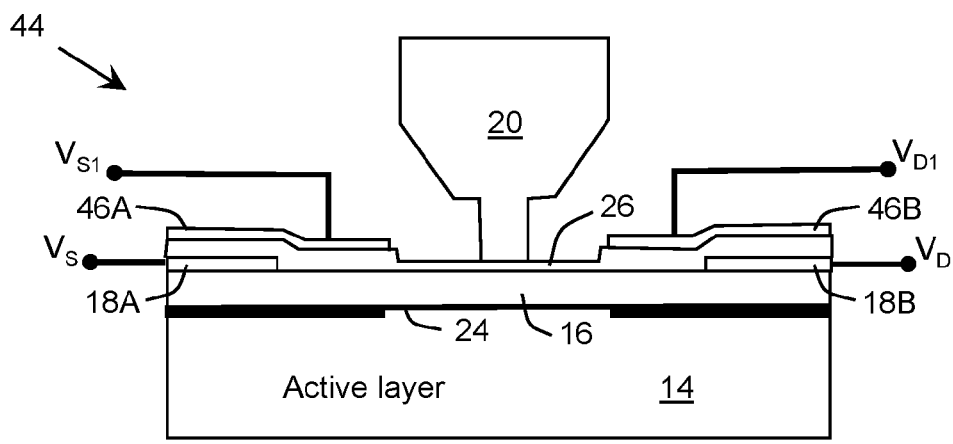
FIG. 13 shows an illustrative device according to a sixth embodiment.

FIG. 13 shows an illustrative device 44 according to a sixth embodiment. Device 44 includes a pair of low conducting field-controlling elements 46A, 46B, each of which is located adjacent to a corresponding source electrode 18A and drain electrode 18B, respectively. The field-controlling elements 46A, 46B are isolated from the respective electrodes 18A, 18B and the semiconductor structure by an isolation layer 26 (e.g., a dielectric layer), which also extends beneath the gate 20. The isolation enables the application of external bias voltages and/or signals to the low conducting elements 46A, 46B via connectors $V_{S1}$, $V_{D1}$, respectively. The external bias voltages and/or signals can be independent from external voltages/signals applied to the corresponding electrodes 18A, 18B via connectors $V_S$, $V_D$.

In an embodiment, the field-controlling elements 46A, 46B are used to provide voltage controlled changes in a conductance of the device channel 24. For example, by applying a voltage bias at a field-controlling element 46A, 46B that is positive with respect to a voltage potential of the channel 24, a two-dimensional electron gas (2DEG) accumulation can be achieved in the corresponding access region without affecting the electron concentration, and therefore the threshold voltage, under the gate 20. Such a configuration can be beneficial, for example, in a high frequency and high transconductance device, particularly one with a sub-micron gate 20, where a resistance of the access regions has a very different can have a significant effect on a maximum frequency of operation of the device. To this extent, the highest electron concentration in the access regions is desirable, however, selective doping of the source-gate and gate-drain can be difficult to achieve. The field-controlling elements 46A, 46B allow for direct control of the conductivity of the access regions without requiring gate recessing, selective doping, material regrowth, and/or the like.

It is understood that the various semiconductor devices described herein can be manufactured using any solution. For example, a device heterostructure can be formed using any solution, e.g., by obtaining (e.g., forming, preparing, acquiring, and/or the like) a substrate 12, forming (e.g., growing, depositing, adhering, and/or the like) an initiation layer 13 and/or a buffer layer 15 thereon, forming an active layer 14 thereon, and forming a barrier layer 16 on the active layer 14. Additionally, metal electrode(s), dielectric layer(s), and/or the like, can be formed on the device heterostructure using any solution. Furthermore, as described herein, the manufacture of the device can include the formation of one or more low conducting field-controlling elements using any solution. It is understood that the manufacture of a device described herein can include additional processing, including for example: the deposition and removal of a temporary layer, such as mask layer; the patterning one or more layers; the formation of one or more additional layers/contacts not shown; application to a submount (e.g., via contact pads); and/or the like.

While shown and described herein as a method of designing and/or fabricating a semiconductor device, it is understood that aspects of the invention further provide various alternative embodiments. For example, in one embodiment, the invention provides a method of designing and/or fabricating a circuit that includes one or more of the semiconductor devices designed and fabricated as described herein.

Figure 14:
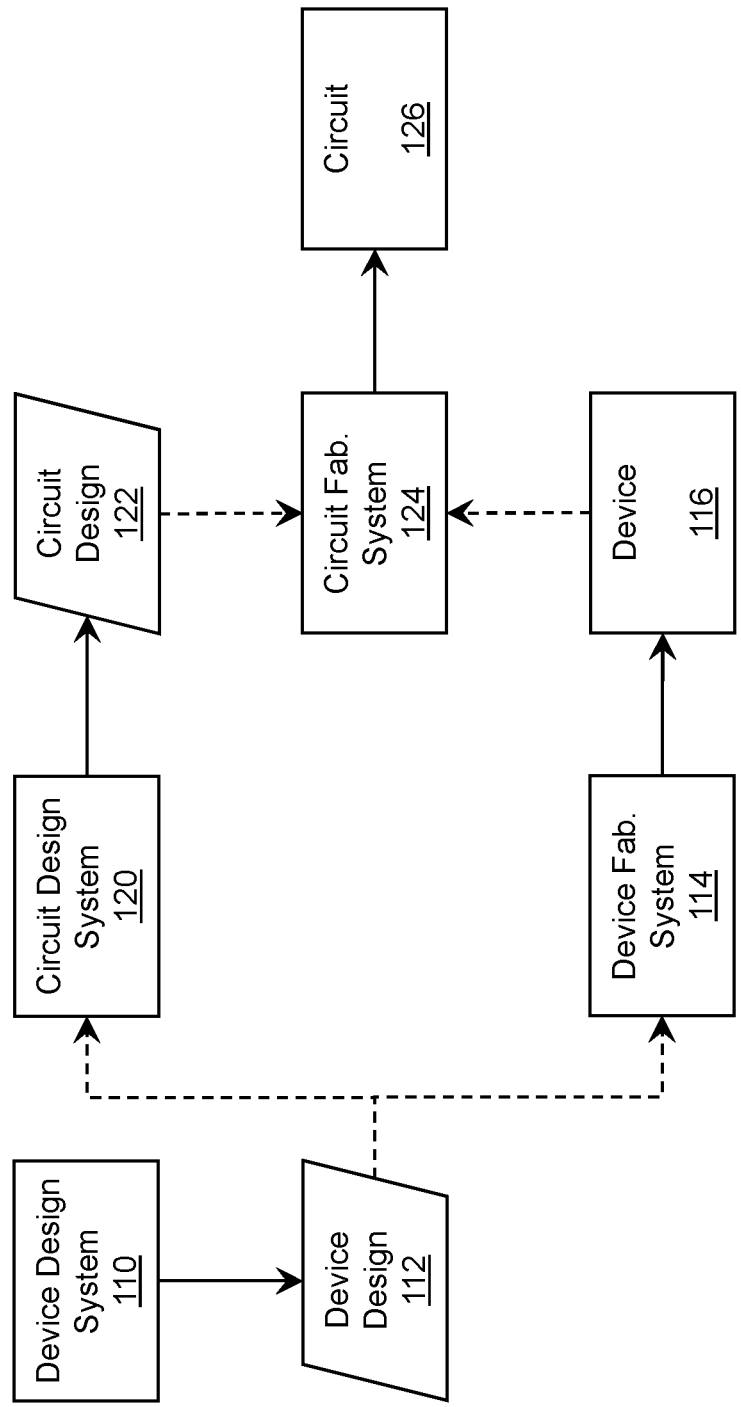
FIG. 14 shows an illustrative flow diagram for fabricating a circuit according to an embodiment.

To this extent, FIG. 14 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A device comprising:
   a semiconductor including an active region;
   source, drain and gate contacts to the active region;
   a barrier layer extending between the source and drain contacts, wherein the gate contact is located on the barrier layer;
   an isolation layer at least partially encapsulating the gate; and
   a first field-controlling element directly contacting the gate,
   wherein a sheet resistance of the first field-controlling element is such that a time constant for the field-controlling element is larger than an inverse of a minimal operating frequency of the device and the time constant for the first field-controlling element is smaller than an inverse of a maximum control frequency of the device, and
   wherein the first field-controlling element includes different electrical properties at different operating frequencies, the first field-controlling element behaving similar to a metal conductor during low frequency operation, and behaving similar to an insulator during high frequency operation.

2. The device of claim 1, wherein the first field-controlling element is formed of a group III nitride material including indium.

3. The device of claim 1, wherein the at least one isolation layer comprises:
   a first isolation layer located in a source-gate spacing between the source contact and the gate contact; and
   a second isolation layer located in the gate-drain spacing between the gate contact and the drain contract.

4. The device of claim 3, wherein the first field-controlling element is located directly on a portion of the gate contact and a portion of the second isolation layer.

5. The device of claim 4, wherein the first isolation layer and the second isolation layer at least partially isolate the first field-controlling element from the semiconductor.

6. The device of claim 4, wherein the first field-controlling element forms a field-modulating plate for the gate.

7. The device of claim 1, further comprising a second field-controlling element isolated from the gate and the first field-controlling element via the at least one isolation layer.

8. The device of claim 7, wherein the first field-controlling element is encapsulated by the at least one isolation layer.

9. The device of claim 7, wherein the second field-controlling element is directly connected to one of: the source contact or the drain contact.

10. The device of claim 9, wherein the second field-controlling element extends laterally over the gate and at least a portion of the first field-controlling element.

11. The device of claim 8, further comprising a third field-controlling element isolated from the gate, the first field-controlling element, and the second field-controlling element via the at least one isolation layer.

12. The device of claim 11, wherein the second field-controlling element extends laterally over the gate and at least a portion of the first field-controlling element, and wherein the third field-controlling element extends laterally over the gate, the first field-controlling element, and the second field-controlling element.

13. The device of claim 11, wherein at least one of the second or third field-controlling elements is formed of metal, and wherein at least one of the second or third field-controlling elements includes different electrical properties at different operating frequencies, wherein at least one of the second or third field-controlling elements behaves similar to a metal conductor during low frequency operation, and behaves similar to an insulator during high frequency operation.

14. A field-effect transistor comprising:
   a source contact, a drain contact, and a device channel there between;
   a barrier layer extending between the source contact and the drain contact;
   a gate located on the barrier layer on a first side of the device channel;
   an isolation layer directly contacting the gate and the drain contact; and
   a first field-controlling element directly contacting a top surface of the gate and extending from the gate toward the drain contact,
   wherein a sheet resistance of the first field-controlling element is such that a time constant for the field-controlling element is larger than an inverse of a minimal operating frequency of the field-effect transistor and the time constant for the first field-controlling element is smaller than an inverse of a maximum control frequency of the field-effect transistor, and
   wherein the first field-controlling element includes different electrical properties at different operating frequencies, the first field-controlling element behaving similar to a metal conductor during low frequency operation, and behaving similar to an insulator during high frequency operation.

15. The transistor of claim 14, wherein the first field-controlling element is formed of a group III nitride material including indium.

16. The transistor of claim 14, wherein the isolation layer covers all of a source-gate spacing and a gate-drain spacing.

17. The transistor of claim 16, further comprising a second field-controlling element contacting the source contact and isolated from the gate and the first field-controlling element via the isolation layer, wherein the second field-controlling element includes different electrical properties at different operating frequencies, the second field-controlling element behaving similar to a metal conductor during low frequency operation, and behaving similar to an insulator during high frequency operation.

18. A field-effect transistor comprising:
   a source contact, a drain contact, and a device channel there between;
   a barrier layer extending between the source contact and the drain contact;
   a gate located on the barrier layer on a first side of the device channel;
   a set of isolation layers directly contacting the gate, the source contact, and the drain contact, wherein the set of isolation layers covers all of a source-gate spacing and a gate-drain spacing; and
   a first field-controlling element directly contacting a top surface of the gate and extending beyond an edge of the gate over a portion of one of the set of isolation layers,
   wherein a sheet resistance of the first field-controlling element is such that a time constant for the field-controlling element is larger than an inverse of a minimal operating frequency of the field-effect transistor and the time constant for the first field-controlling element is smaller than an inverse of a maximum control frequency of the field-effect transistor, and
   wherein the first field-controlling element includes different electrical properties at different operating frequencies, the first field-controlling element behaving similar to a metal conductor during low frequency operation, and behaving similar to an insulator during high frequency operation.

19. The transistor of claim 18, wherein the first field-controlling element is formed of a group III nitride material including indium and wherein the set of isolation layers have a sheet resistance at least an order of magnitude higher than the sheet resistance of the first field-controlling element.

20. The transistor of claim 18, wherein the set of isolation layers encapsulates the gate and the first field-controlling element.

* * * * *